(12) United States Patent
Joshi et al.

(10) Patent No.: US 7,842,555 B2
(45) Date of Patent: Nov. 30, 2010

(54) INTEGRATED TRANSISTOR MODULE AND METHOD OF FABRICATING SAME

(75) Inventors: Rajeev D. Joshi, Cupertino, CA (US);
Jonathan A. Noquil, Surigao del Sur Philippines (PH); Consuelo N. Tangpuz, Lapu-Lapu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 40 days.

(21) Appl. No.: 12/349,140

(22) Filed: Jan. 6, 2009

(65) Prior Publication Data
US 2009/0117690 A1   May 7, 2009

Related U.S. Application Data

(62) Division of application No. 10/876,248, filed on Jun. 24, 2004, now Pat. No. 7,501,702.

(51) Int. Cl.
*H01L 21/60* (2006.01)
*H01L 21/98* (2006.01)

(52) U.S. Cl. ........... 438/123; 257/E21.51; 257/E21.705

(58) Field of Classification Search ................ 438/123; 257/E21.51, E21.705
See application file for complete search history.

(56) References Cited

U.S. PATENT DOCUMENTS

| | | | | |
|---|---|---|---|---|
| 5,703,399 | A * | 12/1997 | Majumdar et al. | 257/723 |
| 6,710,441 | B2 | 3/2004 | Eden et al. | |
| 6,841,869 | B1 * | 1/2005 | Triantafyllou et al. | 257/723 |
| 6,894,397 | B2 | 5/2005 | Pavier et al. | |
| 6,919,644 | B2 * | 7/2005 | Uchida | 257/784 |
| 7,061,102 | B2 | 6/2006 | Eghan et al. | |
| 7,501,702 | B2 | 3/2009 | Joshi et al. | |
| 2003/0011005 | A1 | 1/2003 | Joshi | |
| 2004/0061221 | A1 | 4/2004 | Schaffer | |
| 2005/0285238 | A1 | 12/2005 | Joshi et al. | |

* cited by examiner

*Primary Examiner*—Marcos D. Pizarro
(74) *Attorney, Agent, or Firm*—Thomas R. FitzGerald, Esq.; Jason R. Womer, Esq.; Hiscock & Barclay, LLP

(57) ABSTRACT

An integrated transistor module includes a lead frame that defines at least one low-side land and at least one high-side land. A stepped portion of the lead frame mechanically and electrically interconnects the low-side and high-side lands. A low-side transistor is mounted upon the low-side land with its drain electrically connected to the low-side land. A high-side transistor is mounted upon the high-side land with its source electrically connected to the high-side land.

7 Claims, 5 Drawing Sheets

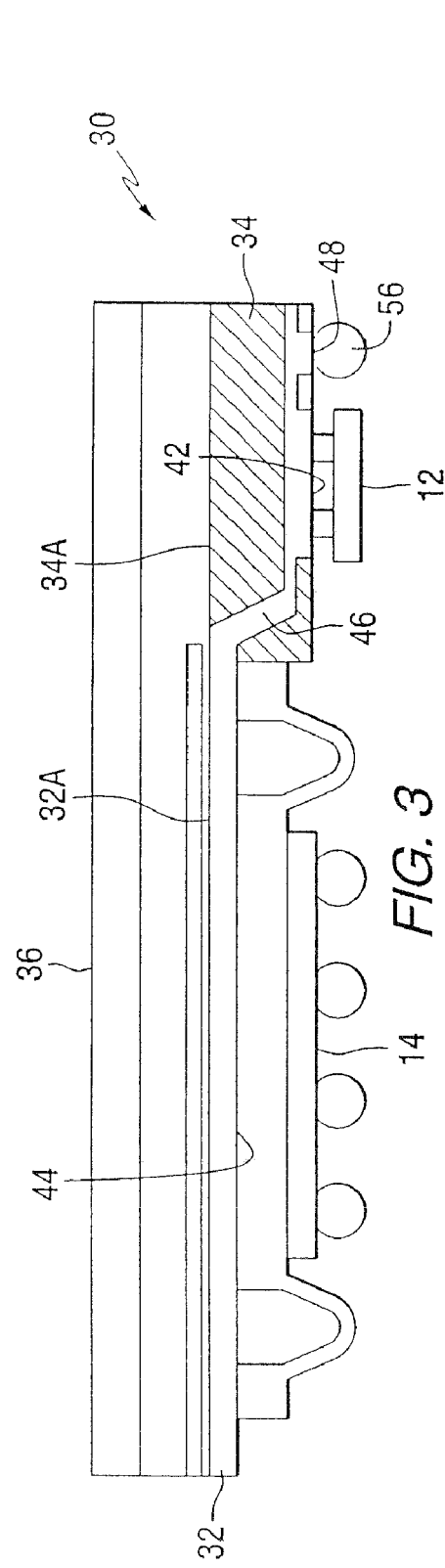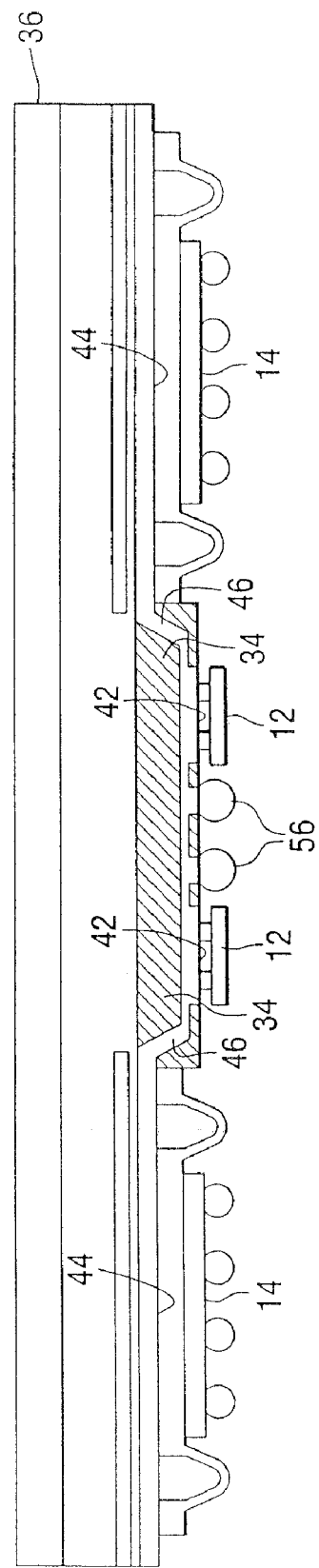

US 7,842,555 B2

INTEGRATED TRANSISTOR MODULE AND METHOD OF FABRICATING SAME

CROSS-REFERENCE TO RELATED APPLICATIONS

This application is a divisional application of U.S. patent application Ser. No. 10/876,248 filed Jun. 24, 2004.

FIELD OF THE INVENTION

The present invention relates generally to semiconductor devices. More particularly, the present invention relates to an integrated transistor module that is suitable for use as a building block for other devices, including synchronous buck converters.

DESCRIPTION OF THE RELATED ART

Typically used in power supplies for cell phones, portable computers, digital cameras, routers, and other portable electronic systems, synchronous buck converters shift DC voltage levels in order to provide power to programmable grid arrays integrated circuits, microprocessors, digital signal processing integrated circuits and other circuits, while stabilizing battery outputs, filtering noise, and reducing ripple. Synchronous buck converters are also used to provide high-current multiphase power in a wide range of date communications, telecom, point-of-load and computing applications.

FIG. 1 shows a simplified schematic diagram of a typical synchronous buck converter. Synchronous buck convert (SBC) 10 includes a high-side metal oxide semiconductor field effect transistor (MOSFET) 12 and a low-side MOSFET 14. The drain D of low-side MOSFET 14 is electrically connected to the source S of high-side MOSFET 12. Most commercial-produced MOSFETs are vertical devices, and are packaged such that the external points of connection to the gate, drain and source are on the same geographic plane of the device.

The connection between the source S and drain D of the high and low-side MOSFETs 12 and 14, respectively, in SBC 10 must have a very low inductance in order for SBC 10 to be used at moderate to high operating/switching frequencies. Where MOSFETs 12 and 14 are configured as discrete devices, the design of the circuit board layout of SBC 10 must be optimized to reduce parasitic inductances. Alternatively, SBC 10 can be configured as a fully-integrated synchronous buck converter in a single package and which is designed and laid out to reduce parasitic inductances in the connection between the source S and drain D of the high and low-side MOSFETs 12 and 14, respectively. Such fully integrated devices, however, tend to be fairly application and/or design specific devices that are often not compatible with other applications and/or designs. Further, the printed circuit board traces/conductors that connect the MOSFETs are typically not well-suited to carrying moderate to high levels of current.

Therefore, what is needed in the art is a non-application specific buck converter having a reduced-inductance or low-inductance connection between the source of the high-side MOSFET and the drain of the low-side MOSFET and which is capable of carrying moderate to high current.

Furthermore, what is needed in the art is an integrated transistor module or building block that provides a connection between the source of a high-side transistor of the module and the drain of a low-side transistor of the module that is capable of carrying moderate to high current and has a reduced or low inductance, and is therefore suitable for use as a building block for the design/construction of a buck converter for use at moderate/high frequencies.

Moreover, what is needed in the art is a method of forming an integrated transistor module or building block that provides a reduced or low inductance connection between the source of a high-side transistor of the module and the drain of a low-side transistor of the module that is capable of carrying moderate to high current, and thereby enables the design/construction of a buck converter for use at high frequencies.

Still further, what is needed in the art is a method of forming a buck converter that is suitable for use a thigh frequencies by using an integrated transistor module or building block having a reduced or low inductance connection between the source of a high-side transistor of the module and the drain of a low-side transistor of the module, and which is capable of carrying moderate to high current.

SUMMARY OF THE INVENTION

The present invention provides an integrated transistor module that provides a low-inductance high-current capacity connection between the transistors, and is useful as a building block for other circuitry, such as, for example, buck converters.

The invention comprises, in one form thereof, an integrated transistor module including a lead frame that defines at least one low-side land and at least one high-side land. A stepped portion of the lead frame mechanically and electrically interconnects the low-side and high-side lands. A low-side transistor is mounted upon the low-side land with its drain electrically connected to the low-side land. A high-side transistor is mounted upon the high-side land with its source electrically connected to the high-side land.

An advantage of the present invention is that an integrated transistor module is provided that includes a low-inductance high-current-capacity connection between the drain of one transistor and the source of another, and which is therefore useful as a building block for a buck converter.

Another advantage of the present invention is that the integrated transistor module is easily and efficiently heat sinked.

A still further advantage of the present invention is that the integrated transistor module is formed from devices using modular/standard packages, and is therefore fabricated according to an efficient process flow.

An even further advantage of the present invention is that the integrated transistor module simplifies the layout and design of printed circuit boards.

Yet another advantage of the present invention is that the integrated transistor module can be used in scalable multiphase DC-DC converter devices.

Moreover, an advantage of the present invention is that the integrated transistor module reduces component counts in DC/DC converter devices.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein:

FIG. 3 is a side view of one embodiment of an integrated FET module of the present invention;

FIG. 4 is a side view of a second embodiment of an integrated FET module of the present invention.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
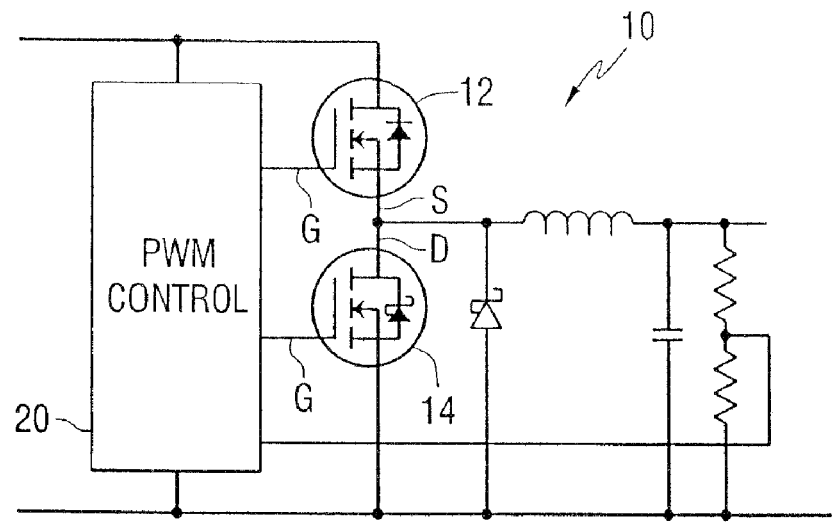
FIG. 1 is a schematic diagram of an exemplary synchronous buck converter.
Figure 2:
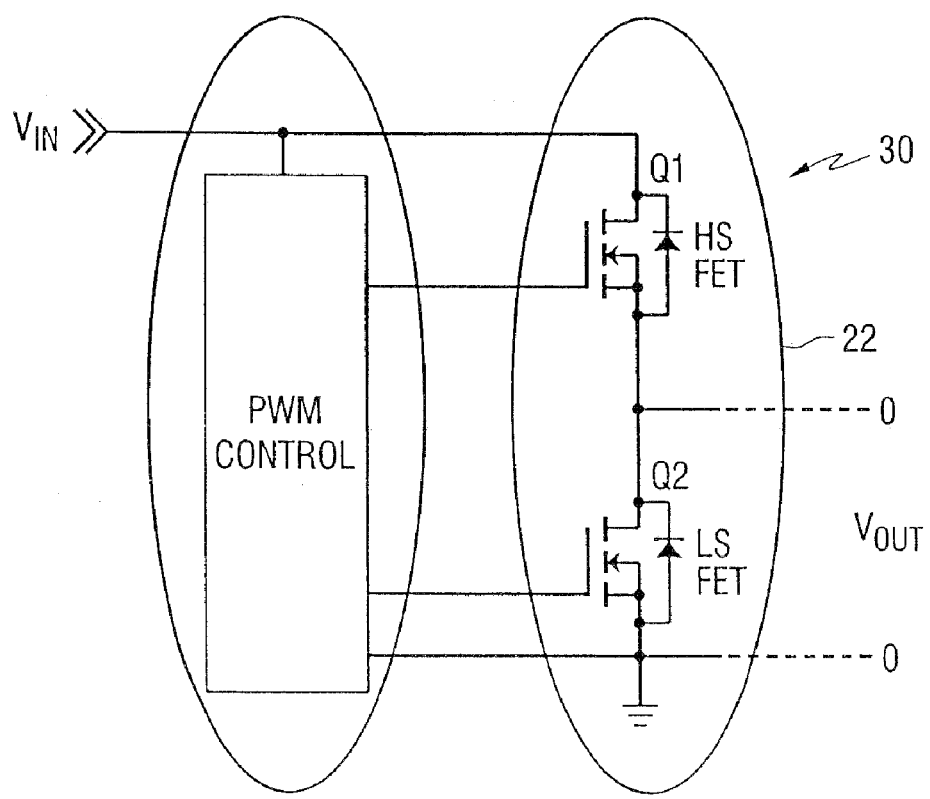
FIG. 2 illustrates the functional modules of the synchronous buck converter of FIG. 1.

Referring now to the drawings and particularly to FIG. 1, there is shown a schematic diagram of an exemplary synchronous buck converter. As discussed above, synchronous buck converter (SBC) 10 includes a high-side metal oxide semiconductor field effect transistor (MOSFET) 12 and a low-side MOSFET 14. The drain D of low-side MOSFET 14 is electrically connected to the source S of high-side MOSFET 12. Further, the gates G of MOSFETs 12 and 14 are connected to corresponding outputs (not referenced) of a pulse-width modulation (PWM) controller 20. As best shown in FIG. 2, the integrated FET module of the present invention integrates the circuitry within circle 22, including MOSFETs 12 and 14.

Referring now to FIGS. 3 and 4, a side view of one embodiment of an integrated transistor module of the present invention is shown before (FIG. 4) and after (FIG. 3) singulation. Integrated transistor module 30 includes high- and low-side transistors 12 and 14, substrate or lead frame 32, molding 34, and heat sink 36. Generally, the high-and low-side transistors 12 and 14, such as, for example, field effect transistors (FETs) or metal oxide semiconductor field effect transistors (MOSFETs), are disposed upon and coupled to substrate or lead frame 32 which provides a low-inductance electrical connection between the drain D of low-side FET 14 and the source S of high-side FET 12, and thus an integrated transistor module 30 that is suitable for use as a building block for other circuits, such as, for example, a buck converter.

High- and low-side FETS 12 and 14 are conventional integrated-circuit MOSFET devices, and are selected so as to be suitable for the application for which integrated FET module 30 is intended. In the embodiment shown, high-side FET 12 is configured as a flip-chip device/package, and low-side FET 14 is configured as a BGA device/package.

Substrate or leadframe 32 is constructed of an electrically conductive material, such as, for example, copper or aluminum, and has a thickness of, for example, from approximately 0.005 to approximately 0.010 inches. Generally, substrate 32 and moldings 34 define at least one high-side land pattern 42 and at least one low-side land pattern 44. The portions of substrate 32 upon which land patterns 42 and 44 are defined are interconnected by a stepped portion 46 of substrate 32. Stepped portion 46 orients high-side land pattern 42 and low-side land pattern 44 in respective planes that are substantially parallel relative to each other. Stepped portion 46 in conjunction with molding 34 dispose the high- and low-side FETS 12 and 14 in a substantially co-planar manner relative to each other. Substrate 32 is half-etched to prepare a pattern on high-side land pattern 42 upon and to which high-side MOSFET 12 is mounted, that includes pad 48.

High-side FETs 12 are flip-chip mounted to corresponding high-side land patterns 42 and low-side FETs 14 are mounted using conventional processes for mounting BGA packages to corresponding low-side land patterns 44. More particularly, the drains D of each low-side FET 14 are attached to a corresponding low-side land pattern 44, and the sources S of each high-side FET 12 are flip-chip attached to high-side land pattern 42.

Moldings 34 are formed upon and cover the side of land patterns 44 opposite to the sides thereof to which high-side FETS 12 are attached. A first or top surface 34A (FIGS. 3 and 6B) of moldings 34 are formed to be substantially coplanar with first or upper surface 32A of substrate 32. Moldings 34 electrically isolate the drains and gates of the high-side FETS 12 from contact with or electrically shorting to heat sink 36 (see FIGS. 3 and 4).

Figure 6A:
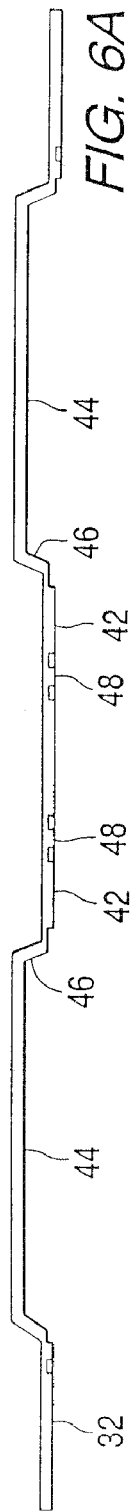
FIGS. 6A-6G illustrate one embodiment of a method for fabricating one embodiment of an integrated FET module of the present invention.
Figure 6B:
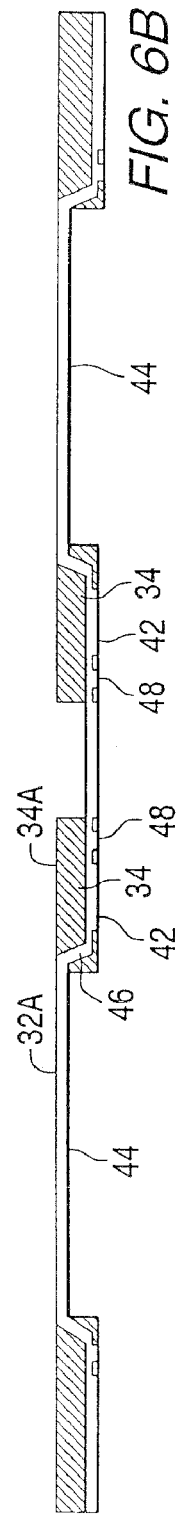
Figure 6C:
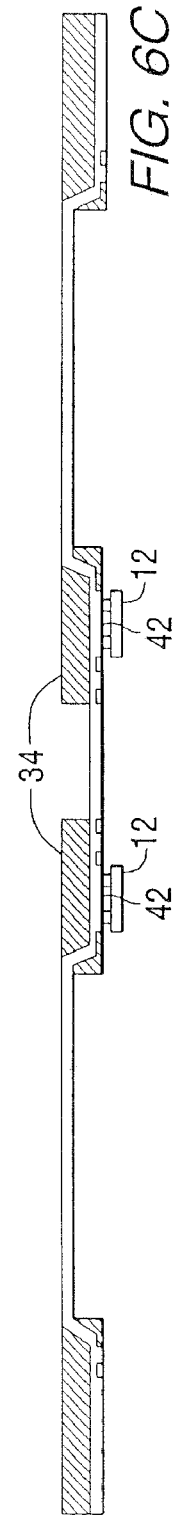
Figure 6D:
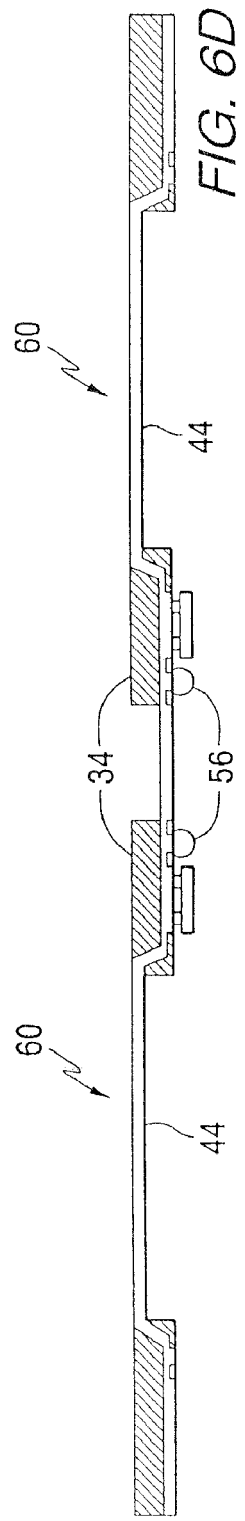

Heat sink 36 is attached in a thermally-conductive manner, such as, for example, a thermally conductive paste or solder paste, to first or upper surface 32A of substrate 32. Heat sink 36 extends the entire length and/or width of integrated FET module 30 since moldings 34 prevent shorting of the drains and gates of the high-side FETS 12 to heat sink 36. Heat sink 36 is constructed of a thermally-conductive material, such as, for example, a strip of copper or other suitable thermally-conductive material FIGS. 6A-6G illustrate one embodiment of a method for fabricating one embodiment of an integrated FET module of the present invention. Preformed lead frame 32 is configured with mirror-image sides or halves, as shown in FIG. 6A, from each of which respective integrated FET modules 30 are formed. Molded portions 34 are formed on each of the mirror-image halves of substrate 32, as shown in FIG. 6B. Molded portions 34 cover stepped portion 46 and the side of low-side land 44 that is opposite to the side thereof upon which low-side FET 14 is mounted, and form top surfaces 34A that are substantially coplanar with first or upper surface 32A of substrate 32. High-side FETS 12 are then flip-chip mounted onto high-side land patterns 42, as shown in FIG. 6C. Solder balls 56 are formed on pads 48, which are later reflowed to electrically connect substrate 32, and thus source S of high-side FET 12 and drain D of low-side FET 14, of integrated FET module 30 to a circuit board or other device, as shown in FIG. 6D.

Figure 6E:
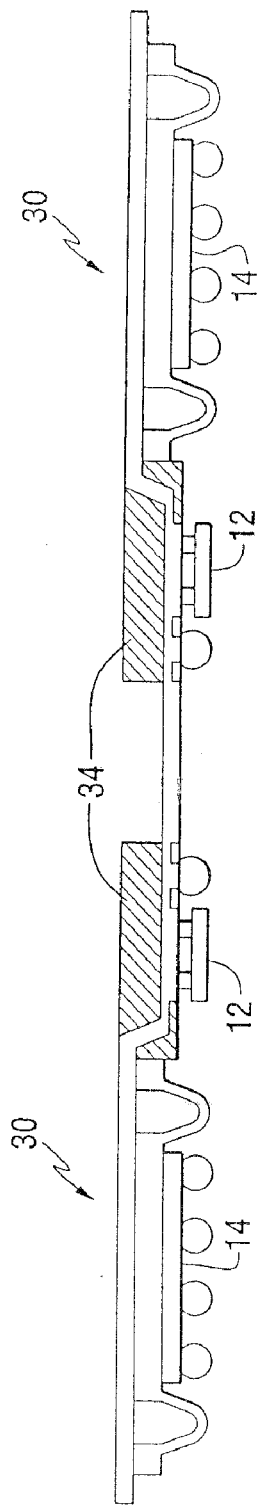
Figure 6F:
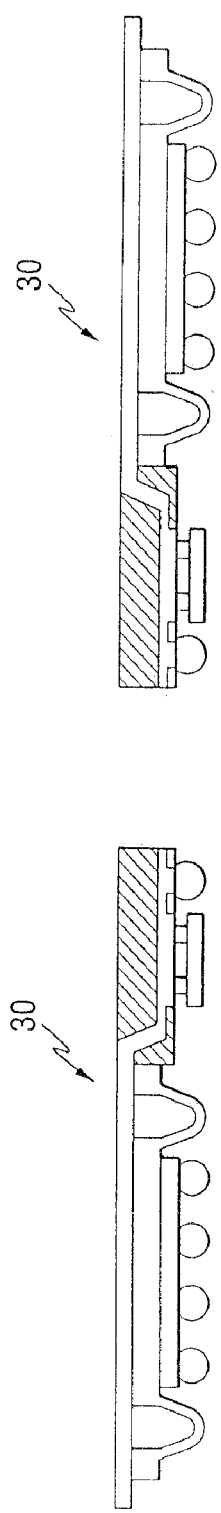
Figure 6G:
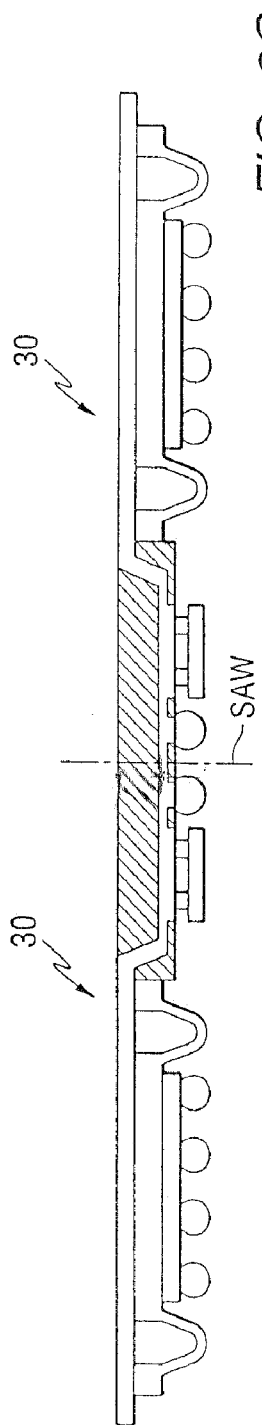

The low-side FETs 14 are then mounted by conventional BGA package attach to low-side lands 44 of substrate 32, as shown in FIG. 6E, and the two mirror-image halves are singulated, such as, for example, by punching (as shown in FIG. 6F) or by sawing (as shown in FIG. 6G).

It should be particularly noted that singulation of integrated FET modules 30 at the stage of fabrication shown in FIG. 6D forms two subassemblies 60. Each subassembly 60 includes one or more high-side FETs 12 mounted to corresponding high-side lands 42 of substrate 32 and isolated by corresponding moldings 34. Substrate 32, a portion of which extends from moldings 34 and defines land 44, forms an embedded connector strip suitable for connecting the source of high-side FET 12 to another package or device, such as low-side FET 14. Although presented as connecting high-side FET 12 to low-side FET 14, substrate 32 can be alternately configured to connect virtually any other desired type of integrated circuit device and/or package to high-side FET 12.

Figure 5A:
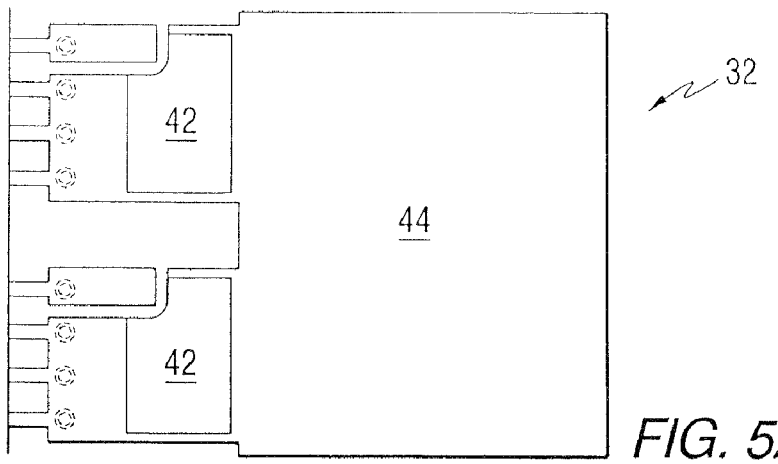
FIGS. 5A-5C show top views of one embodiment of a lead frame for a third embodiment of an integrated FET module of the present invention, and the method of fabricating same.
Figure 5B:
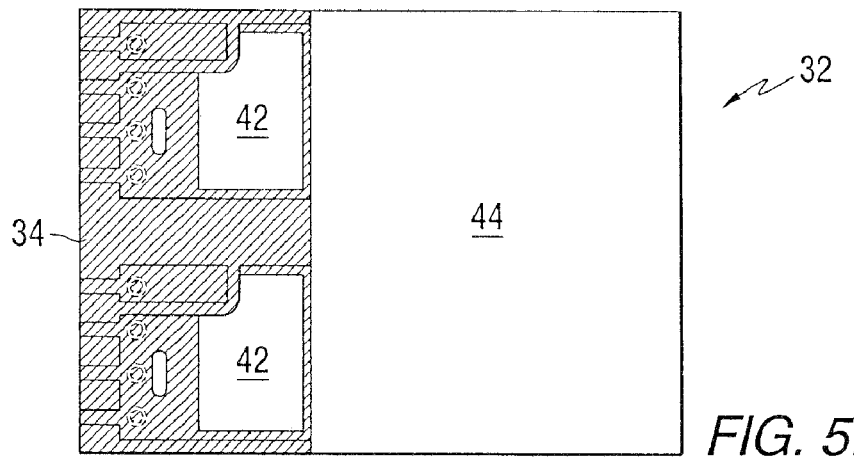
Figure 5C:
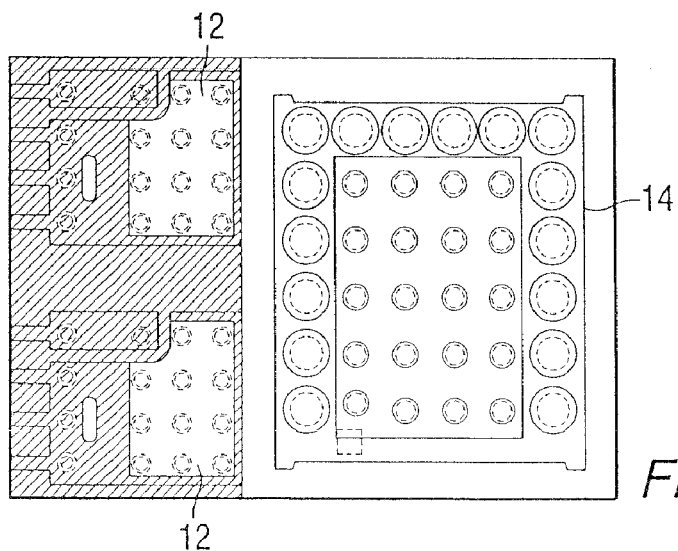

The embodiment of substrate 32 shown in FIGS. 5A-5C corresponds to an embodiment of integrated FET module 30 that includes two high-side FETS 12 and one low-side FET 14. Accordingly, in that embodiment, substrate 32 includes molding 34 which is disposed around the periphery of high-side land patterns 42 defined by substrate 32. The sources S of respective high-side FETS 12 are flip-chip mounted to high-side land patterns 42 and low-side FET 14 is mounted as described above. Thus, sources S of high-side FETS 12 are electrically connected via substrate 32 to the drain D of low-side FET 14 in a similar manner to that described above. This interconnection of the FET sources considerably simplifies the layout of the printed circuit board relative to the layout required for interconnecting discrete components.

In use, integrated FET module 30 forms a building block for other circuitry, such as, for example, buck converters or other circuitry requiring two MOSFETs having the drain of one MOSFET connected the source of the other via substrate/leadframe 32 that is capable of carrying relatively high current and has a relatively low inductance. The surfaces of integrated FET module 30 are substantially coplanar and thereby provide a device to which heatsink 36 is easily attached and/or integrated, and which has a larger surface area than would otherwise be possible since the high-side FET 12 is electrically isolated from heatsink 36 by molding 34 and thus the likelihood of FET 12 shorting to heatsink 36 is minimized.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A method of fabricating an integrated transistor module, comprising:

forming a continuous metal leadframe that defines at least one low-side land on a first plane and at least one high-side land on a second plane substantially parallel to and distinct from said first plane vertically offset from said low-side land, and a stepped portion mechanically and electrically interconnecting said low-side and high-side lands;

enclosing in an electrically insulating material a portion of said leadframe proximate said high-side land, an upper surface of said insulating material on a side of said leadframe that is opposite said high-side land being substantially coplanar relative to a side of said leadframe opposite said low-side land; and mounting a high-side transistor upon said high-side land, a source of said high-side transistor being electrically connected to said high-side land.

2. The method of claim 1, comprising the further step of mounting a low-side transistor upon said low-side land, a drain of said low-side transistor electrically connected to said low-side land, said leadframe electrically interconnecting said source of said high-side transistor with said drain of said low-side transistor.

3. The method of claim 2, wherein said high-side transistor is flip-chip mounted upon said high-side land.

4. The method of claim 2, wherein said low-side transistor is contained within a ball grid array package.

5. The method of claim 2, wherein said low-side and said high-side transistor comprise metal oxide semiconductor field effect transistors.

6. The method of claim 1, further comprising the step of thermally coupling a heat sink to the side of said lead frame opposite said high-side land and thereby to said low-side and said high-side transistors.

7. The method of claim 6, wherein said heat sink extends over said molded portion.

* * * * *